(12) United States Patent
Oshikiri (10) Patent No.: US 7,739,467 B2
(45) Date of Patent: Jun. 15, 2010

(54) SEMICONDUCTOR MEMORY AND DATA ACCESS METHOD

(75) Inventor: Takashi Oshikiri, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 746 days.

(21) Appl. No.: 11/668,735

(22) Filed: Jan. 30, 2007

(65) Prior Publication Data

US 2007/0192627 A1 Aug. 16, 2007

(30) Foreign Application Priority Data

Feb. 13, 2006 (JP) ............................. 2006-035076

(51) Int. Cl.
*G06F 12/00* (2006.01)

(52) U.S. Cl. ............... 711/163; 711/220; 711/E12.091; 711/E12.099; 711/E12.078

(58) Field of Classification Search ................. 711/163, 711/220, 103

See application file for complete search history.

(56) References Cited

U.S. PATENT DOCUMENTS 4,482,979 A * 11/1984 May ............................ 345/531

| | | | | |
|---|---|---|---|---|
| 6,006,314 A | * | 12/1999 | Suzuki | 711/217 |
| 2002/0002654 A1 | * | 1/2002 | Tomohiro | 711/103 |
| 2005/0071592 A1 | * | 3/2005 | DeCaro | 711/163 |
| 2006/0023877 A1 | | 2/2006 | Tsuruga | |
| 2006/0107072 A1 | * | 5/2006 | Umezu et al. | 713/193 |

FOREIGN PATENT DOCUMENTS

| DE | 103 38 701 A1 | 3/2005 |
|---|---|---|
| JP | 2005-108273 | 4/2005 |
| WO | WO 01/10079 A1 | 2/2001 |
| WO | WO 2005/076139 A1 | 8/2005 |

* cited by examiner

*Primary Examiner*—Reginald G Bragdon
*Assistant Examiner*—Larry T Mackall
(74) *Attorney, Agent, or Firm*—Oblon, Spivak, McClelland, Maier & Neustadt, L.L.P.

(57) ABSTRACT

While a semiconductor memory operates in a first operation mode with high security, an encrypted command is inputted and then decoded to acquire the first address information. After the semiconductor memory comes into a second operation mode where the level of security is lower than that of the first operation mode, a command is inputted. Then, the second address information is acquired from the command. A control circuit in the semiconductor memory generates an address of 10 bits by using the first address information as a high-order 4 bits and the second address information as a low-order 6 bits and outputs the address to a memory array. With this operation, it becomes possible to read/write data from/to the memory array.

24 Claims, 5 Drawing Sheets

SEMICONDUCTOR MEMORY AND DATA ACCESS METHOD

BACKGROUND OF THE INVENTION

1. Field of the Invention

The present invention relates to a security technique for a semiconductor memory.

2. Description of the Background Art

For protection against unjust reading of data stored in a semiconductor memory or against unjust writing of data into a semiconductor memory, encryption techniques have been used. Encryption of commands for a semiconductor memory makes it hard to observe the commands and further makes it impossible to actually generate any unjust command.

As another method specialized for protection against unjust writing, a memory array is divided into blocks of certain capacity and a flag bit (implemented by a nonvolatile memory) for protection against writing is provided for each block. For a flag bit corresponding to an object block for writing, a system makes it "write enabled" prior to writing and then writes data into the object block. After writing of data, the system makes the flag bit "write disabled" (protected), to ensure protection against writing.

The Patent Document 1, Japanese Patent Application Laid Open Gazette No. 2005-108273, relates to a semiconductor memory in which a protect flag is stored in a memory block. In the technique disclosed in the Patent Document 1, when a write command is inputted from a host, the content of the protect flag is checked and if the protect flag indicates "write enabled", writing of data is performed.

As discussed above, using an encryption technique makes it difficult to observe a command. When a command is encrypted, however, the processing speed disadvantageously decreases. That is because the encrypted command needs to be decrypted by using a predetermined algorithm and the load of this processing is heavy. Though a scramble processing whose load is light may be used in order to avoid this problem, since the scramble processing is weak in security, this processing disadvantageously increases possibility of decoding the command.

Further, the above method in which a flag bit is provided to ensure protection against writing can not also protect a semiconductor memory in terms of security. Specifically, this method is a technique for protection against unintended writing due to, e.g., runaway of software in a writing system, not against writing by a malevolent outsider.

The technique disclosed in the above Patent Document 1 is used to disable a system from writing data if the protect flag is on, not used to take protective measures against fraudulent actions in consideration of the possibility of manipulating the protect flag by using an unjust program.

SUMMARY OF THE INVENTION

The present invention is intended for a semiconductor memory comprising a data memory part, a control circuit and an input/output circuit. According to the present invention, the semiconductor memory is a memory which operates, switching between a first operation mode and a second operation mode and the first operation mode ensures higher security for a command than the second operation mode, the control circuit comprises an operation mode memory part for storing a current operation mode therein, and a command discrimination circuit for discriminating a command inputted from the outside through the input/output circuit, the command discrimination circuit includes a means of deciphering a command by loosening the security for the command inputted in at least the first operation mode, a means of acquiring first address information from a command inputted in the first operation mode, and a means of acquiring second address information from a command inputted in the second operation mode, the control circuit further comprises an address information memory part for storing the first address information therein, which is acquired by the command discrimination circuit in the first operation mode, and an address generator circuit for generating a specified address from all or part of the second address information acquired by the command discrimination circuit in the second operation mode and all or part of the first address information stored in the address information memory part, and the control circuit accesses the data memory part by using the specified address outputted from the address generator circuit.

In the present invention, since it is necessary to issue commands in two operation modes with different levels of security in order to access the data memory part, it is difficult to analyze the commands. This ensures effective protection against unjust reading or writing of data.

According to an aspect of the present invention, the data memory part is divided into a plurality of blocks to be controlled and a block address is acquired in the first operation mode, and memory areas in a designated block can be thereby sequentially accessed in the second operation mode.

This controls the access on a block-by-block basis in the first operation mode with high security and allows sequential operations in the second operation mode, to prevent a decrease in processing speed.

Therefore, it is an object of the present invention to provide a technique to increase the security for a semiconductor memory.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
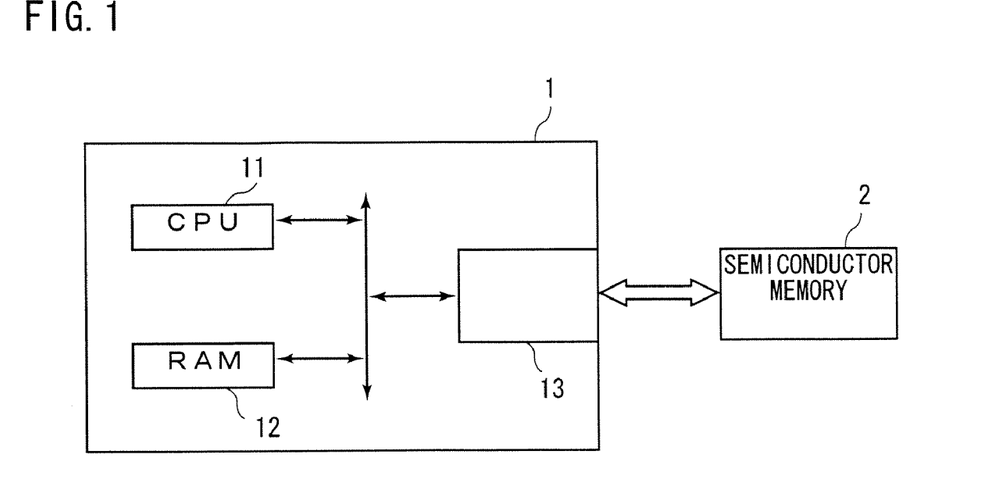
FIG. 1 is a block diagram showing an information processing apparatus which accesses a semiconductor memory.

Hereinafter, the preferred embodiments of the present invention will be discussed with reference to figures. FIG. 1 is a block diagram showing an information processing apparatus 1 and a semiconductor memory 2 in accordance with the present preferred embodiment. The information processing apparatus 1 comprises a CPU 11, a RAM 12 and a memory slot 13. The information processing apparatus 1 reads out data from the semiconductor memory 2 mounted on the memory slot 13 and executes various data processings by using the CPU 11 and RAM 12. Alternatively, the information processing apparatus 1 writes data into the semiconductor memory 2.

Examples of the information processing apparatus 1 are a PDA (Personal Digital Assistance), a set-top box, a game device and the like. If the information processing apparatus 1 is a PDA or a set-top box, the semiconductor memory 2 is a memory to which an application program or content data is recorded, or if the information processing apparatus 1 is a game device, the semiconductor memory 2 is a game cartridge.

Figure 2:
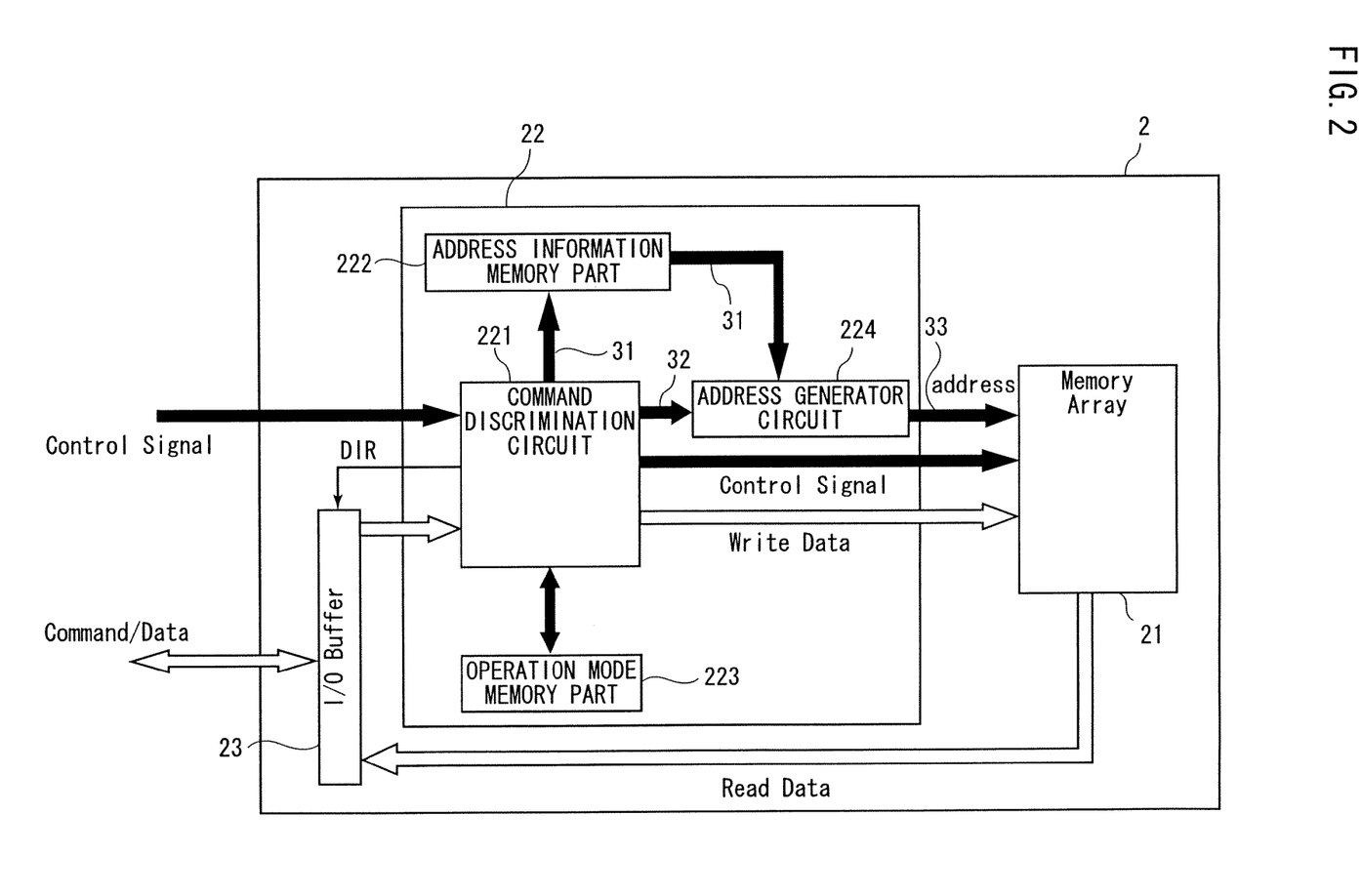
FIG. 2 is a functional block diagram showing the semiconductor memory.

FIG. 2 is a functional block diagram showing the semiconductor memory 2. The semiconductor memory 2 comprises a memory array 21 which is a nonvolatile memory consisting of numerous memory cells for storing information therein, a control circuit 22 for controlling access to the memory array 21 and an I/O buffer 23 which is a circuit for inputting/outputting data and commands from/to the information processing apparatus 1.

The control circuit 22 comprises a command discrimination circuit 221, an address information memory part 222, an operation mode memory part 223 and an address generator circuit 224.

The command discrimination circuit 221 is a circuit for discriminating the content of a command inputted from the information processing apparatus 1. If a command generated in the information processing apparatus 1 is a read command for data, the command includes a read instruction and a read address. If the command is a write command, the command includes a write instruction and a write address. These read/write commands are generated by the CPU 11 in the information processing apparatus 1 and transferred to the semiconductor memory 2 through a command bus. Then, the commands are inputted to the command discrimination circuit 221 through the I/O buffer 23. If the command is a write command, write data generated by the CPU 11 is transferred to the semiconductor memory 2 through a data bus. Then, the data is inputted to the command discrimination circuit 221 through the I/O buffer 23. Though the command bus and the data bus are multiplexed by using a common bus in the first preferred embodiment as shown in FIG. 2, independent buses may be provided for individual uses.

The command discrimination circuit 221 discriminates the content of the inputted command and if the command is a read command, the command discrimination circuit 221 sends a read control signal to the memory array 21. If the command is a write command, the command discrimination circuit 221 sends a write control signal. The command discrimination circuit 221 further acquires a read address or a write address from a read command or a write command. If the command is a write command, the command discrimination circuit 221 sends inputted write data to the memory array 21. The command discrimination circuit 221 further performs direction switching of the I/O buffer 23 to output data outside through the data bus.

The operation mode memory part 223 is a memory part for storing information on a current operation mode of the semiconductor memory 2 therein. The semiconductor memory 2 of the first preferred embodiment can operate with two operation modes switched therebetween. The first operation mode is a mode where a command is encrypted. In other words, the command is protected with high security in this mode. The second operation mode is a mode where a command is scrambled. The second operation mode is lower in security than the first operation mode but allows a higher-speed operation than the first operation mode. Thus, the semiconductor memory 2 of the first preferred embodiment can operate, switching between the first operation mode with very high security and heavy processing load and the second operation mode with security lower than that of the first operation mode and light processing load.

Though it is assumed herein that a scrambling operation refers to an operation to cause disturbance of information by bit operation or bit manipulation and an encryption operation refers to an operation using a predetermined algorithm to disable the data itself from being decoded, these are exemplary operations. The basic feature of the present preferred embodiment lies in that the security for the commands transferred between the information processing apparatus 1 and the semiconductor memory 2 is higher in the first operation mode than in the second operation mode. Therefore, there may be a case where raw commands are transferred with no security in the second operation mode and various encryption techniques with different levels of security, including the scrambling operation, are used in the first operation mode. Further, it is also an important feature that the level of security is lower and the processing load is lighter in the second operation mode than in the first operation mode.

Switching between the operation modes is performed by the information processing apparatus 1. The CPU 11 generates an operation mode switching command and this command is inputted to the command discrimination circuit 221 through the I/O buffer 23. Receiving the operation mode switching command, the command discrimination circuit 221 rewrites operation mode information stored in the operation mode memory part 223. The control circuit 22 operates in accordance with the information stored in the operation mode memory part 223.

The command discrimination circuit 221 comprises a decoding circuit for decoding an encrypted command and a descrambler circuit for descrambling a scrambled command. If the current operation mode is the first operation mode, the command discrimination circuit 221 decodes the inputted command by using the decoding circuit and acquires the instruction and the address information of the command. If the current operation mode is the second operation mode, the command discrimination circuit 221 descrambles the inputted command by using the descrambler circuit and acquires the instruction and the address information of the command.

The address information memory part 222 is a memory part for storing an address included in the command inputted by the command discrimination circuit 221 in the first operation mode (this address is referred to as "first address information 31") therein. Receiving a mode switching command for switching to the first operation mode, the command discrimination circuit 221 switches the operation mode to the first operation mode and subsequently decodes the inputted command by using the decoding circuit. Then, the command discrimination circuit 221 stores the first address information 31 included in the decoded command into the address information memory part 222.

The address generator circuit 224 receives an address included in the command inputted by the command discrimination circuit 221 in the second operation mode (this address is referred to as "second address information 32"). Receiving a mode switching command for switching to the second operation mode, the command discrimination circuit 221 switches the operation mode to the second operation mode and subsequently descrambles the inputted command by using the descrambler circuit. Then, the command discrimination circuit 221 outputs the second address information 32 included in the descrambled command to the address generator circuit 224. The address generator circuit 224 generates a specified address 33 from the second address information 32 inputted from the command discrimination circuit 221 and the first address information 31 stored in the address information memory part 222. The specified address 33 is an address to be given to the memory array 21 and it is a read address when the command is a read command and it is a write address when the command is a write command.

Specifically, the address generator circuit 224 generates the specified address 33 with the first address information 31 as high-order address bits and the second address information 32 as low-order address bits. For example, assuming that the memory array 21 is a memory array of 1 K×1 Byte=1 KByte, this memory array has an address space of 1 K and an address of 10 bits is given to each memory area which is capable of storing data of 1 Byte therein. In such a case, for example, from the first address information 31 of 4 bits and the second address information 32 of 6 bits, the specified address 33 of 10 bits is generated.

A flow of data read/write operation by the above-discussed semiconductor memory 2 and the information processing apparatus 1 will be discussed below with reference to FIGS. 3 and 4.

A general operation flow will be discussed with reference to FIG. 3. First, the semiconductor memory 2 comes into the first operation mode (Step S1). Specifically, a command inputted from the information processing apparatus 1 is brought into a mode with high security implemented by encryption. In this state, it becomes very difficult for a third party to access the memory array 21 by issuing any command. This mode change is executed with the mode switching command issued by the information processing apparatus 1. The operation mode may be controlled by a loader program of the information processing apparatus 1 so that the semiconductor memory 2 can be brought into the first operation mode immediately after the start-up of the information processing apparatus 1.

In a state where the semiconductor memory 2 operates in the first operation mode, the information processing apparatus 1 generates an encrypted command and outputs it. The semiconductor memory 2 receives the encrypted command (Step S2). This encrypted command is an address set command generated by the information processing apparatus 1 to set the first address information 31.

Next, the command discrimination circuit 221 decodes the encrypted command by using the decoding circuit to extract the first address information 31 (Step S3).

Then, the command discrimination circuit 221 stores the extracted first address information 31 into the address information memory part 222 (Step S4).

Next, the information processing apparatus 1 generates a mode switching command for the second operation mode and outputs it. The semiconductor memory 2 receives the mode switching command for the second operation mode (Step S5). This mode switching command is encrypted.

Receiving the mode switching command, the command discrimination circuit 221 decodes this command. Then, the command discrimination circuit 221 judges that this command is the mode switching command for the second operation mode and stores information that the current operation mode is the second operation mode into the operation mode memory part 223. The semiconductor memory 2 thereby comes into the second operation mode (Step S6). In other words, the semiconductor memory 2 comes into the mode where the level of security is lower and the processing speed is higher than those in the first operation mode.

In a state where the semiconductor memory 2 is in the second operation mode, the information processing apparatus 1 generates a scrambled command and outputs it. The semiconductor memory 2 receives the scrambled command (Step S7).

The command discrimination circuit 221 descrambles the inputted command by using the descrambler circuit. Then, the command discrimination circuit 221 extracts the second address information 32 from the command (Step S8). The command including the second address information 32 is, for example, a scrambled read command. In other words, this command includes a read instruction and the second address information 32. Alternatively, this command may be a command generated to set the second address information 32, other than the command including the read instruction.

Then, the command discrimination circuit 221 outputs the second address information 32 to the address generator circuit 224 (Step S9). Receiving the second address information 32 from the command discrimination circuit 221, the address generator circuit 224 generates the specified address 33 from this second address information 32 and the first address information 31 stored in the address information memory part 222 (Step S10).

Figure 4:
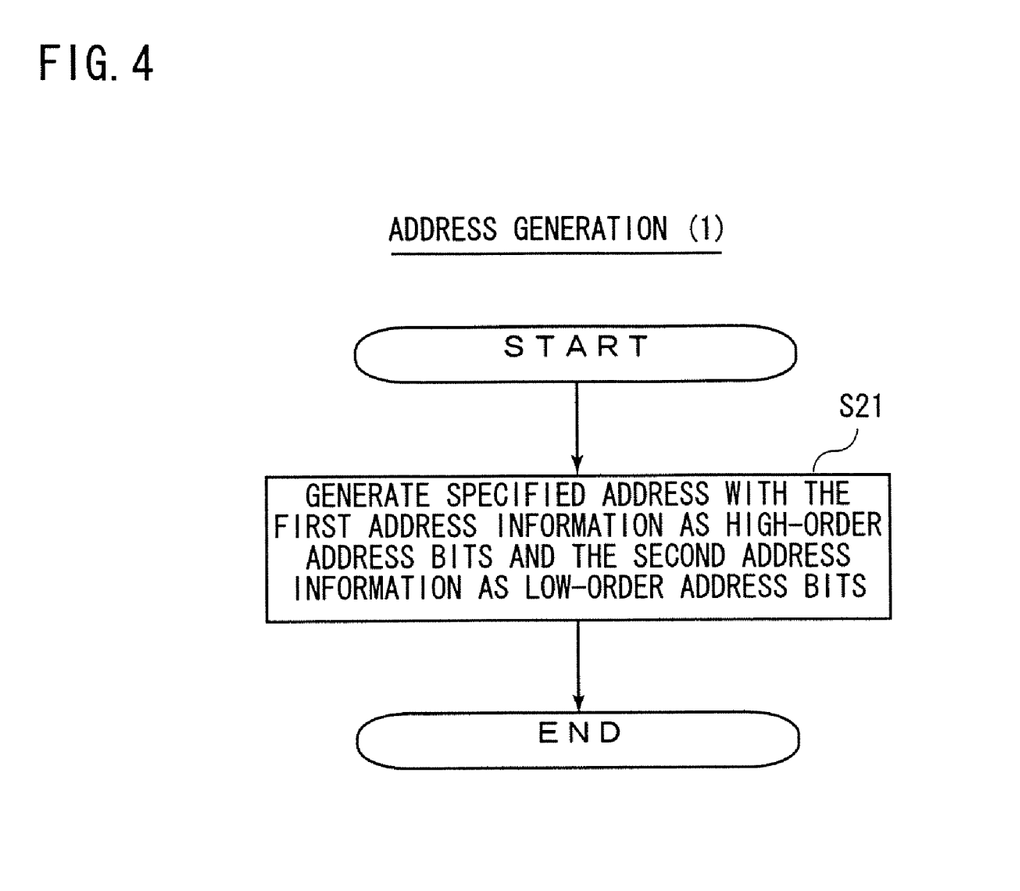
FIG. 4 is a flowchart showing an operation flow for generation of the specified address in accordance with a first preferred embodiment.

FIG. 4 is a flowchart showing an operation flow for generation of the specified address 33. In the first preferred embodiment, the first address information 31 forms the high-order 4 bits of the specified address 33 to be outputted to the memory array 21 and the second address information 32 forms the low-order 6 bits of the specified address 33 to be outputted to the memory array 21. Therefore, the address generator circuit 224 generates the specified address 33 with the first address information 31 as the high-order 4 bits and the second address information 32 as the low-order 6 bits (Step S21).

Figure 3:
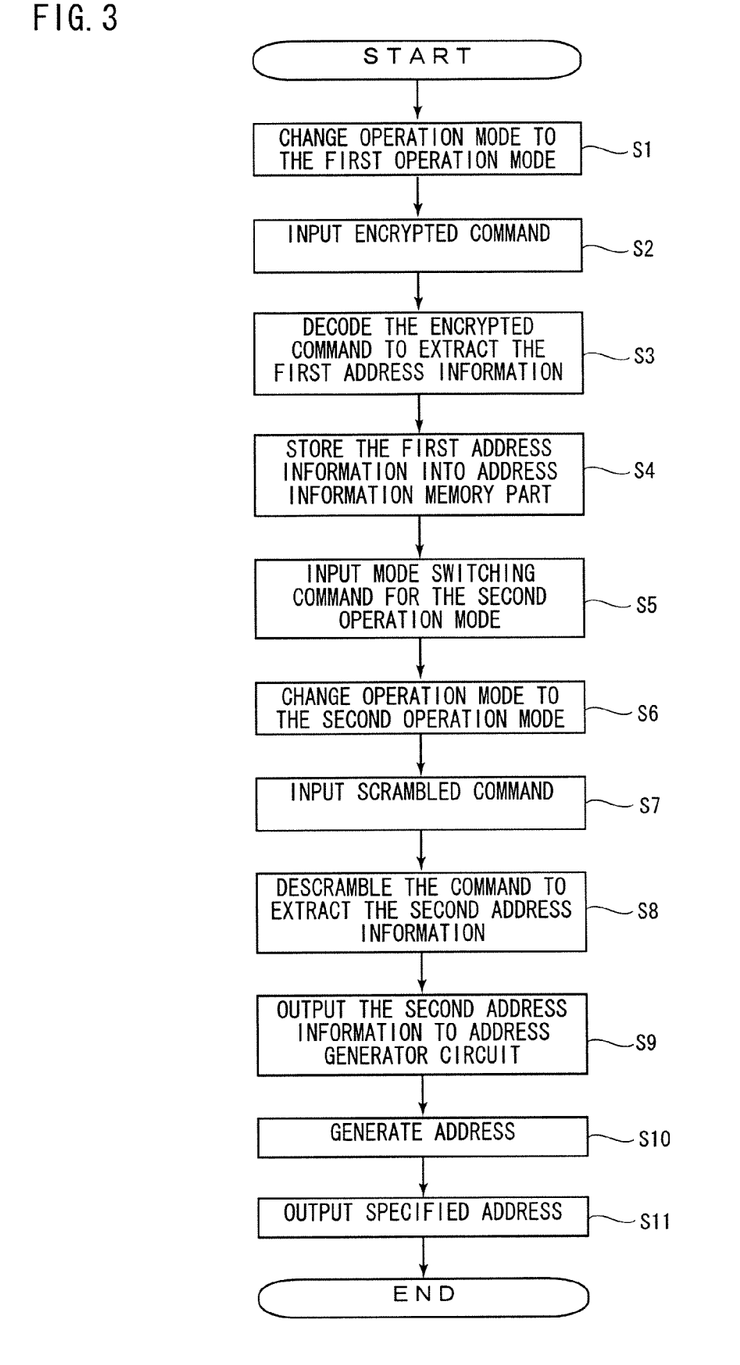
FIG. 3 is a flowchart showing an operation flow of a control circuit, from extraction of the first and second address information to output of a specified address.

Back to FIG. 3, the address generator circuit 224 gives the generated specified address 33 to the memory array 21 (Step S11). With this operation, if the command is a read command, a read instruction is given to the memory array 21 as a control signal and data stored at an address specified by the specified address 33 is read out. The read-out data is transferred to the information processing apparatus 1 through a read data bus and the I/O buffer 23. At that time, the command discrimination circuit 221 performs direction switching of the I/O buffer 23 to enable the data to be outputted. If the command is a write command, a write instruction is given to the memory array 21 as a control signal and write data is also given to the memory array 21 through the data bus, and this allows data to be written at an address specified by the specified address 33.

Thus, the semiconductor memory 2 of the first preferred embodiment accesses the memory array 21 by using the first address information 31 which is extracted in the first operation mode with high security and the second address information 32 which is extracted in the second operation mode where the level of security is lower and the processing load is lighter than those in the first operation mode. Therefore, the address is generated from a plurality of commands issued in different modes with different levels of security, to makes it very difficult to analyze the commands. It is therefore possible to ensure effective protection against unjust reading or writing of data. Further, since the first operation mode ensures a firm security and the mode change to the second operation mode allows an increase in processing speed, it is possible to achieve both the security of data and efficient data transfer.

Though all of the first address information 31 and all of the second address information 32 are used to generate the specified address 33 in the first preferred embodiment, all or part of the first address information 31 and all or part of the second address information 32 may be used to generate the specified address 33. Further, though the high-order 4 bits and the low-order 6 bits constitute the specified address 33 of 10 bits in the first preferred embodiment, the number of high-order bits, the number of low-order bits and the number of total bits are examples and not limited to the above examples.

In the first preferred embodiment, the first address information 31 forms the high-order 4 bits of the specified address 33 and the second address information 32 forms the low-order 6 bits of the specified address 33. Therefore, if the first address information 31 specifies a block address of the memory array 21, it is possible to control the access on a block-by-block basis in the first operation mode with high security.

For example, assuming that the memory array 21 is a memory array of 1 K×1 Byte=1 KByte as discussed above, this memory is divided into 16 blocks. In this case, the high-order 4-bit part in the 10-bit address is an address to designate a block. With this operation, when the first address information 31 is stored in the address information memory part 222, this allows the access to a block designated by the first address information 31. In other words, when the second address information 32 is inputted in the second operation mode, it is possible to access any address in the block designated by the first address information 31. On the other hand, it is substantially impossible to access any block other than the block designated by the first address information 31 and this ensures high security.

Therefore, after the operation mode is changed to the second operation mode, by transferring the second address information 32 which corresponds to the low-order bits from the information processing apparatus 1 to the semiconductor memory 2 sequentially, it is possible to sequentially access the areas in the accessible block. Specifically, a high-level access limitation is realized on a block-by-block basis in the first operation mode with high security, and if the first address information 31 is set in the first operation mode, data access is performed in the second operation mode where the processing speed is relatively high.

Next, if access is made to a different block, the information processing apparatus 1 outputs a command to change the operation mode to the first operation mode again. Then, after the operation mode is changed to the first operation mode, the information processing apparatus 1 gives the first address information 31 designating a different block to the semiconductor memory 2. Further, the information processing apparatus 1 outputs the mode switching command for the second operation mode. With this operation, it becomes possible to sequentially access the data in the designated block in the second operation mode again.

The Second Preferred Embodiment

Next, the second preferred embodiment of the present invention will be discussed below. Constitutions of the information processing apparatus 1 and the semiconductor memory 2 of the second preferred embodiment are the same as those shown in FIGS. 1 and 2. The second preferred embodiment is different from the first preferred embodiment in the method of generating the specified address 33 in the address generator circuit 224.

The general operation flow where the control circuit 22 extracts the first address information 31 and the second address information 32 and outputs the specified address 33 is the same as that shown in the flowchart of FIG. 3. The first address information 31 is a block address of the memory array 21 which is managed on a block-by-block basis and the second address information 32 is the whole address (byte address) including a block address. For example, assuming that the memory array 21 has an address space of 10 bits and this memory array 21 is divided into 16 blocks, since a block address consists of 4 bits, the first address information 31 has 4 bits and the second address information 32 has 10 bits.

Figure 5:
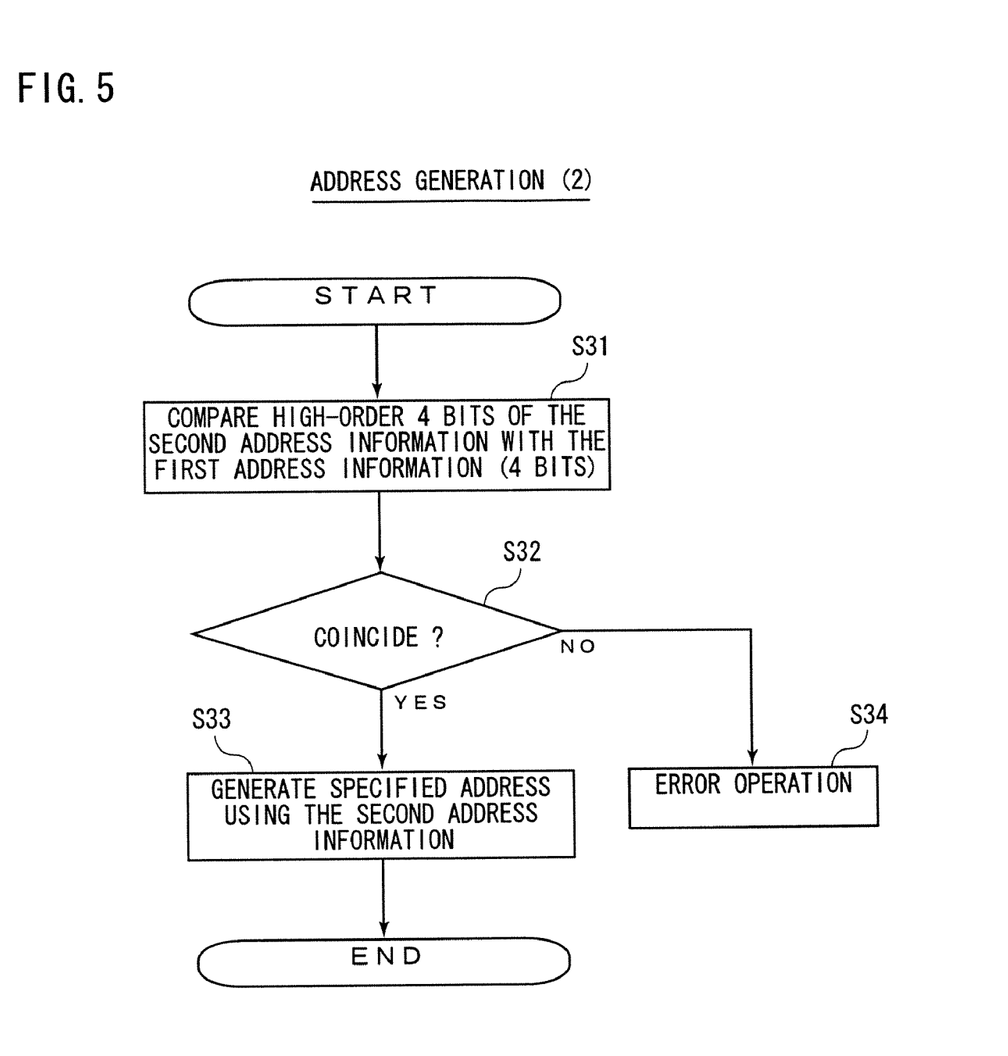
FIG. 5 is a flowchart showing an operation flow for generation of the specified address in accordance with a second preferred embodiment.

With reference to FIG. 5, an address generation will be discussed below. In Step S9 of FIG. 3, the command discrimination circuit 221 outputs the second address information 32 to the address generator circuit 224. Receiving the second address information 32, the address generator circuit 224 compares the high-order 4 bits of the second address information 32 with the first address information 31 stored in the address information memory part 222 (Step S31).

The first address information 31 (of 4 bits) which is a block address is stored in the address information memory part 222 and the address generator circuit 224 compares the high-order 4 bits of the second address information 32 having 10 bits with the first address information 31 to judge if these 4-bit addresses coincide with each other. If these 4-bit addresses coincide with each other, this indicates that a memory area designated by the second address information 32 should exist in the block designated by the first address information 31 stored in the address information memory part 222. In other words, it means that an area in the block whose security is loosened by the first address information 31 is designated by the second address information 32.

If these 4-bit addresses coincide with each other ("YES" in Step S32), the second address information 32 is outputted to the memory array 21 as the specified address (Step S33). With this operation, if the command is a read command, a read instruction is given to the memory array 21 as a control signal and data stored at an address specified by the specified address 33 is read out. The read-out data is transferred to the information processing apparatus 1 through the read data bus and the I/O buffer 23. If the command is a write command, a write instruction is given to the memory array 21 as a control signal and write data is also given to the memory array 21 through the data bus, and this allows data to be written at an address specified by the specified address 33.

If these 4-bit addresses do not coincide ("NO" in Step S32), an error operation is performed (Step S34). Specifically, the access to the memory array 21 is made disabled and an error signal is transferred to the information processing apparatus 1.

Thus, the semiconductor memory 2 of the second preferred embodiment compares the first address information 31 which is extracted in the first operation mode with high security with the second address information 32 which is extracted in the second operation mode where the level of security is lower and the processing load is lighter than those in the first operation mode, and if part of those coincide with each other, it becomes possible to access the memory array 21. Therefore, since a plurality of commands which are issued in the modes with different levels of security are used to judge if the access is enabled, it is very difficult to analyze the commands. This allows effective protection against unjust reading or writing of data. Further, since the first operation mode ensures a firm security and the mode change to the second operation mode allows an increase in processing speed, it is possible to achieve both the security of data and efficient data transfer.

Though the access to an area in a block designated by the first address information 31 is enabled if it is found that the first address information 31 and part of the second address information 32 coincide with each other after comparison therebetween in the second preferred embodiment, this case where the first address information 31 is a block address is an example. The basic feature of the present preferred embodiment lies in that the first address information 31 extracted in the first operation mode and the second address information 32 extracted in the second operation mode are compared with each other and it is judged if the access is enabled in accordance with the comparison result. Therefore, all or part of the first address information 31 may be used to be compared and all or part of the second address information 32 may be used to be compared. Further, the present invention can be applied to a case where the first address information 31 is not a block address. Though the case where the block address consists of 4 bits and the whole address consists of 10 bits has been discussed, this case is an example and the present invention is not limited to the above case.

If the first address information 31 is a block address, like in the first preferred embodiment, when the first address information 31 is stored in the address information memory part 222, this allows the access to a block designated by the first address information 31. In other words, if the second address information 32 inputted in the second operation mode is an address designating an area in the same block, the access to any address can be performed.

Therefore, after the operation mode is changed to the second operation mode, by sequentially transferring a plurality of second address information 32 from information processing apparatus 1 to the semiconductor memory 2, it is possible to sequentially access a plurality of areas in the accessible block. Specifically, a high-level access limitation is realized on a block-by-block basis in the first operation mode with high security, and if the first address information 31 is set in the first operation mode, data access is performed in the second operation mode where the processing speed is relatively high. On the other hand, it is substantially impossible to access any block other than the block designated by the first address information 31 and this ensures high security.

Next, if access is made to a different block, the information processing apparatus 1 outputs a command to change the operation mode to the first operation mode again. Then, after the operation mode is changed to the first operation mode, the information processing apparatus 1 gives the first address information 31 designating a different block to the semiconductor memory 2. Further, the information processing apparatus 1 outputs the mode switching command for the second operation mode. With this operation, it becomes possible to sequentially access the data in the designated block in the second operation mode again.

<Variation 1>

Herein, discussion will be made on a method for improving the security for the semiconductor memory 2 of the first and second preferred embodiments. The information processing apparatus 1 outputs not only the first address information but also a certified value of any bit length in the first operation mode. Specifically, the information processing apparatus 1 outputs an encrypted certified value as well as the encrypted first address information 31. This certified value may be included in a command for transferring the first address information 31 or may be transferred by issuing another command.

Then, the information processing apparatus 1 issues a command for transferring the second address information 32, with the certified value included again in the second operation mode. Then, the command discrimination circuit 221 stores the certified value inputted in the first operation mode into a register or the like and outputs the second address information 32 to the address generator circuit 224 only when the stored certified value coincides with the certified value inputted in the second operation mode. This allows further improvement in security.

<Variation 2>

In the first and second preferred embodiments, it has been discussed that it becomes possible to control the access to the memory array 21 on a block-by-block basis by using the first address information 31 as a block address. Though the case where the block address consists of 4 bits and the byte address (whole address) consists of 10 bits has been discussed in the above preferred embodiments, the ratio of the block address to the whole address may not be constant in the memory array 21.

Though the block address consists of 4 bits and the memory array 21 of 1 KByte is divided into 16 blocks in the above preferred embodiments, there may be a case, for example, where a block address for the first block consists of 5 bits and the first block is further divided into two parts to be controlled.

As the first method of accessing such a semiconductor memory 2, ratio information of a block address is transferred, being included in a command, from the information processing apparatus 1 to the semiconductor memory 2. For example, information that the ratio of a block address is 4/10 (4 bits), which is included in a command, is sent to the semiconductor memory 2. The command discrimination circuit 221 also stores the ratio information of the block address into the operation mode memory part 223 as information on the current operation mode. After that, receiving the first address information 31 and the second address information 32 which are included in commands, the command discrimination circuit 221 extracts these addresses in accordance with this ratio information of the block address.

The second method can be adopted in the second preferred embodiment. In this method, the first address information 31 to be transferred in the first operation mode is used as the whole address including a block address, not only a block address. For example, the same address as the second address information 32 included in the read command which is transferred first after the operation mode is changed to the second operation mode may be used as the first address information 31.

With this operation, the command discrimination circuit 221 can judge which block is designated by the address specified by the first address information 31. Then, by enabling the ratio information of the block address for each block to be referred to, the command discrimination circuit 221 can extract the block address from the first address information 31. Therefore, without transferring the ratio information of the block address which is included in a command, by transferring commands for different blocks, it is possible to discriminate the block and extract the first address information 31 and the second address information 32 in the semiconductor memory 2.

Thus, this variation 2 can be applied to the case where the semiconductor memory 2 consists of blocks designated by block addresses having different bit lengths. It is possible to achieve customization, such as a case where data which needs high security is stored in a block designated by a block address whose bit length is long or a case where data which needs to be read out at high speed is stored in a block designated by a block address whose bit length is short. When the block address has a short bit length, the block size is large and it is possible to sequentially read out a lot of data in the second operation mode. On the other hand, when the block size is small, though the processing speed decreases since it is necessary to change blocks by frequently changing the operation mode to the first operation mode, the level of security increases.

<Other Variations>

As a variation of the second preferred embodiment, there may be a case where the first address information 31 and the second address information 32 have the same address length. In this variation, the first address information 31 and the second address information 32 each use a full 10-bit address. In this case, the minimum access unit of the memory array 21 is equal to a unit of block. Therefore, in order to access all the memory areas, it is necessary to once change the operation mode to the first operation mode and change the block. Though the processing speed thereby decreases, since the level of security becomes much higher, this variation may be applied to a product which strongly requires high security more than high-speed operation. There may be another case where the first address information 31 uses a full 10-bit address and the second address information 32 uses 0 bits. Specifically, the first address information 31 is set in the first operation mode, and a read/write command specifying no address is issued in the second operation mode. Also in this case, though the minimum access unit of the memory array 21 is equal to a unit of block and the processing speed decreases, a system with very high security can be achieved.

Though the minimum access unit of the memory array 21 is a unit of Byte in the above preferred embodiments, it is a matter of course that the access unit may be a page. For example, a memory to which access is made on a page-by-page basis, such as 1 Page=4 Bytes, can be used.

Thus, the semiconductor memory 2 of this variation allows protection against unjust reading or writing of data. If the information processing apparatus 1 is a game device, it is possible to effectively protect a game program stored in the semiconductor memory 2 against fraudulent reading. Further, in a service where the information processing apparatus 1 which is a game device downloads a game program via a network and stores the game program into the semiconductor memory 2, it is possible to effectively protect the game program from being stored in a game cartridge by a fraudulent means.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory, comprising:
   a data memory part;
   a control circuit; and
   an input/output circuit, wherein
   said semiconductor memory is a memory that switches between a first operation mode and a second operation mode, and said first operation mode ensures higher security for a command than said second operation mode;
   said control circuit includes:
      an operation mode memory part that stores a current operation mode therein, and
      a command discrimination circuit that discriminates a command inputted from the outside of said semiconductor memory through said input/output circuit, said command discrimination circuit including:
         means for deciphering a command by loosening the security for said command inputted in at least said first operation mode,
         means for acquiring first address information from a command inputted in said first operation mode, and
         means for acquiring second address information from a command inputted in said second operation mode;
   said control circuit further includes
      an address information memory part that stores said first address information therein, which is acquired by said command discrimination circuit in said first operation mode, and
      an address generator circuit that generates a specified address from all or part of said second address information acquired by said command discrimination circuit in said second operation mode and all or part of said first address information stored in said address information memory part; and
   said control circuit accesses said data memory part by using said specified address outputted from said address generator circuit.

2. The semiconductor memory according to claim 1, wherein
   said first address information forms a high-order bit address of said specified address and said second address information forms a low-order bit address of said specified address.

3. The semiconductor memory according to claim 2, wherein said data memory part is divided into a plurality of blocks to be controlled, said high-order bit address is a block address of said data memory part, and said command discrimination circuit acquires said high-order bit address, and memory areas in a block designated by said high-order bit address can be sequentially accessed in said second operation mode.

4. The semiconductor memory according to claim 3, wherein
   blocks other than said block designated by said high-order bit address can not be substantially accessed in said second operation mode.

5. The semiconductor memory according to claim 3, wherein
   said data memory part consists of a plurality of blocks which are designated by block addresses of different bit lengths.

6. The semiconductor memory according to claim 1, wherein
   a certified value is included in a command inputted in said first operation mode, and
   if a certified value included in a command inputted in said second operation mode coincides with said certified value inputted in said first operation mode, access to said data memory part is enabled.

7. A semiconductor memory, comprising:
   a data memory part;
   a control circuit; and
   an input/output circuit, wherein
   said semiconductor memory is a memory that switches between a first operation mode and a second operation mode and said first operation mode ensures higher security for a command than said second operation mode;
   said control circuit includes
      an operation mode memory part that stores a current operation mode therein, and
      a command discrimination circuit that discriminates a command inputted from the outside of said semiconductor memory through said input/output circuit, said command discrimination circuit including
         means for deciphering a command by loosening the security for said command inputted in at least said first operation mode, means for acquiring first address information from a command inputted in said first operation mode, and means for acquiring second address information from a command inputted in said second operation mode;

said control circuit further includes an address information memory part that stores said first address information therein, which is acquired by said command discrimination circuit in said first operation mode, and an address generator circuit that compares all or part of said second address information acquired by said command discrimination circuit in said second operation mode with all or part of said first address information stored in said address information memory part and generates a specified address from all or part of said second address information only if these coincide with each other; and said control circuit accesses said data memory part by using said specified address outputted from said address generator circuit.

8. The semiconductor memory according to claim 7, wherein said data memory part is divided into a plurality of blocks to be controlled, said first address information is a block address of said data memory part, said second address information is an address corresponding to a unit of access of said data memory part, and said address generator circuit outputs said second address information as a specified address if a high-order block address included in said second address information coincides with said first address information.

9. The semiconductor memory according to claim 8, wherein said command discrimination circuit acquires said first address information, and memory areas in a block designated by said first address information can be sequentially accessed in said second operation mode.

10. The semiconductor memory according to claim 9, wherein blocks other than said block designated by said first address information can not be substantially accessed in said second operation mode.

11. The semiconductor memory according to claim 8, wherein said data memory part consists of a plurality of blocks which are designated by block addresses of different bit lengths.

12. The semiconductor memory according to claim 7, wherein a certified value is included in a command inputted in said first operation mode; and if a certified value included in a command inputted in said second operation mode coincides with said certified value inputted in said first operation mode, access to said data memory part is enabled.

13. A data access method of accessing a data memory part in a semiconductor memory which comprises said data memory part, a control circuit and an input/output circuit, wherein said semiconductor memory is a memory which operates, switching between a first operation mode and a second operation mode, said method comprising:

a) inputting a command from the outside of said semiconductor memory by using said control circuit in a state where said semiconductor memory operates in said first operation mode with higher security for a command than said second operation mode;

b) acquiring first address information from a command inputted in said first operation mode by said control circuit;

c) bringing said semiconductor memory into said second operation mode;

d) inputting a command from the outside of said semiconductor memory by using said control circuit in a state where said semiconductor memory operates in said second operation mode;

e) acquiring second address information from a command inputted in said second operation mode by said control circuit;

f) generating a specified address from all or part of said first address information and all or part of said second address information by using said control circuit; and g) accessing said data memory part by using said generated specified address by said control circuit.

14. The data access method according to claim 13, wherein said first address information forms a high-order bit address of said specified address and said second address information forms a low-order bit address of said specified address.

15. The data access method according to claim 14, wherein said data memory part is divided into a plurality of blocks to be controlled, said high-order bit address is a block address of said data memory part, and after said high-order bit address is acquired by executing said steps a) to c), memory areas in a block designated by said high-order bit address can be sequentially accessed in said second operation mode by repeating said steps d) to g).

16. The data access method according to claim 15, wherein blocks other tan said block designated by said high-order bit address can not be substantially accessed in said second operation mode.

17. The data access method according to claim 15, wherein said data memory part consists of a plurality of blocks which are designated by block addresses of different bit lengths.

18. The data access method according to claim 13, wherein a certified value is included in a command inputted in said first operation mode, and if a certified value included in a command inputted in said second operation mode coincides with said certified value inputted in said first operation mode, access to said data memory part is enabled.

19. A data access method of accessing a data memory part in a semiconductor memory which comprises said data memory part, a control circuit and an input/output circuit, wherein said semiconductor memory is a memory which operates, switching between a first operation mode and a second operation mode, said method comprising:

a) inputting a command from the outside of said semiconductor memory by using said control circuit in a state where said semiconductor memory operates in said first operation mode with higher security for a command than said second operation mode;

b) acquiring first address information from a command inputted in said first operation mode by said control circuit;

c) bringing said semiconductor memory into said second operation mode;

d) inputting a command from the outside of said semiconductor memory by using said control circuit in a state where said semiconductor memory operates in said second operation mode;

e) acquiring second address information from a command inputted in said second operation mode by said control circuit;
f) comparing all or part of said first address information with all or part of said second address information by using said control circuit and generating a specified address from all or part of said second address information by using said control circuit only if these coincide with each other; and
g) accessing said data memory part by using said generated specified address by said control circuit.

20. The data access method according to claim 19, wherein
said data memory part is divided into a plurality of blocks to be controlled,
said first address information is a block address of said data memory part,
said second address information is an address corresponding to a unit of access of said data memory part, and
said second address information is outputted as a specified address in said step f) if a high-order block address included in said second address information coincides with said first address information.

21. The data access method according to claim 20, wherein said first address information is acquired in said steps a) to c) and memory areas in a block designated by said first address information can be sequentially accessed in said second operation mode by repeating said steps d) to g).

22. The data access method according to claim 21, wherein blocks other than said block designated by said first address information can not be substantially accessed in said second operation mode.

23. The data access method according to claim 20, wherein said data memory part consists of a plurality of blocks which are designated by block addresses of different bit lengths.

24. The data access method according to claim 19, wherein a certified value is included in a command inputted in said first operation mode, and
if a certified value included in a command inputted in said second operation mode coincides with said certified value inputted in said first operation mode, access to said data memory part is enabled.

* * * * *